(12) United States Patent
Kapusta

(10) Patent No.: US 8,487,659 B2
(45) Date of Patent: Jul. 16, 2013

(54) COMPARATOR WITH ADAPTIVE TIMING

(75) Inventor: Ronald Kapusta, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 151 days.

(21) Appl. No.: 13/092,465

(22) Filed: Apr. 22, 2011

(65) Prior Publication Data
US 2012/0268185 A1 Oct. 25, 2012

(51) Int. Cl.
G01R 25/00 (2006.01)
(52) U.S. Cl.
USPC ....... 327/3; 327/12; 327/43; 327/57; 327/261
(58) Field of Classification Search
USPC ............... 327/3, 9, 12, 33, 37, 43, 45, 51, 52, 327/57
See application file for complete search history.

(56) References Cited

U.S. PATENT DOCUMENTS

| | | | |
|---|---|---|---|
| 5,027,116 A | 6/1991 | Armstrong et al. | |
| 5,247,241 A | 9/1993 | Ueda | |
| 6,400,302 B1 | 6/2002 | Amazeen et al. | |
| 7,095,345 B2 | 8/2006 | Nguyen et al. | |
| 7,167,121 B2 | 1/2007 | Carreau et al. | |
| 7,342,463 B2 | 3/2008 | Brokaw et al. | |
| 7,400,118 B1 | 7/2008 | Zhang et al. | |
| 7,425,857 B2 * | 9/2008 | Confalonieri et al. | 327/264 |
| 7,701,256 B2 | 4/2010 | Hurrell et al. | |
| 7,834,793 B2 | 11/2010 | Carreau et al. | |
| 8,044,654 B2 | 10/2011 | Kapusta, Jr. | |
| 8,063,675 B2 * | 11/2011 | Igarashi et al. | 327/143 |
| 8,248,108 B2 * | 8/2012 | Santoro et al. | 327/63 |
| 2008/0100490 A1 | 5/2008 | Chatal et al. | |
| 2008/0284406 A1 | 11/2008 | Kapusta | |
| 2009/0102780 A1 | 4/2009 | Brown | |
| 2009/0273739 A1 | 11/2009 | Brown | |

OTHER PUBLICATIONS

Analog Devices Inc., "14-Bit, 2500 MSPS, RF Digital-to-Analog Converter", AD9739 Datasheet, Rev. 0, 56 pages, Jan. 2009.
Chen et al., "A 6-bit 600-MS/s 5.3-mW Asynchronous ADC in 0.13-μm CMOS," IEEE Journal of Solid-State Circuits, vol. 41, No. 12, pp. 2669-2680, Dec. 2006.
Ginsburg et al., "Dual Time-Interleaved Successive Approximation Register ADCs for an Ultra-Wideband Receiver," IEEE Journal of Solid-State Circuits, vol. 42, No. 2, pp. 247-257, Feb. 2007.
Verma et al., "An Ultra Low Energy 12-bit Rate-Resolution Scalable SAR ADC for Wireless Sensor Nodes," IEEE Journal of Solid-State Circuits, vol. 42, No. 6, pp. 1196-1205, Jun. 2007.

* cited by examiner

Primary Examiner — An Luu
(74) Attorney, Agent, or Firm — Kenyon & Kenyon LLP

(57) ABSTRACT

An adaptive delay device that provides a delay to a signal based on circuit conditions such as temperature, supply voltage values and/or fabrication processes. The adaptive delay device may respond to circuit conditions by charging a capacitive device to a threshold voltage. A comparator may incorporate the adaptive delay device to provide adaptive timing for the comparator functions thereby attaining improved noise performance and/or reduce power consumption.

11 Claims, 7 Drawing Sheets

100

COMPARATOR WITH ADAPTIVE TIMING

FIELD OF INVENTION

The present invention relates to signal processors, and more particularly to a device for tracking operation of adjacent circuitry in response to process, voltage and temperature (PVT) variations experienced by the adjacent circuitry.

BACKGROUND

Successive approximation register (SAR) analog-to-digital converters (ADC) perform analog to digital conversions. The SAR ADC includes a number of different components including comparators.

FIG. 1 illustrates a conventional comparator configuration within a SAR ADC. A conventional SAR ADC 100 includes an analog input, a sample and hold amplifier 105, a digital-to-analog converter (DAC) 110, a comparator 120, and logic 130. The comparator 120 includes a pre-amplifier 123, a delay device 125 and latch 127. The pre-amplifier 123 amplifies the input signals and outputs the amplified input signal to the latch, improving the input referred noise and linearity of the comparator. In order to allow the preamplifier 123 time to amplify the input signal, a control signal RESET is delayed before going to the latch, so that the latch is held in a known reset state while the preamplifier is amplifying. Once the delayed reset signal is released, the latch will regenerate and the comparator makes it decision. The delay of the delay device 125 is fixed by inserting an inverter or series of inverters in the circuit path. A delayed output signal DEL_RESET from the delay device 125 is provided to the latch 127. FIG. 2 illustrates an exemplary timing diagram of a conventional comparator, such as comparator 120.

Typically, as shown, by the preamplifier output 230, the preamplifier 123 operates for some period of time (t1 to t2) before the latch 127 is released. The maximum speed of a SAR ADC 100 is dependent upon the operating speed of the digital logic and switches such as those that form the comparator 120. The operating speed of the digital logic and switches, e.g., inverters and latches, vary in response to various circuit conditions such as variations in the supply voltage, variations in temperature, or fabrication process variations across different manufacturing lots of integrated chips. Examples of fabrication process parameters may be device characteristics, such as threshold voltage and oxide thickness.

When the delay through the delay elements 125 becomes shorter because of the faster operating conditions, such as rises in circuit temperature, supply voltage increases, process effects, or other conditions, the signal DEL_RESET 220 may be output sooner. Consequently, the preamplifier 123 has less time to amplify before the latch 127 is released, as shown by 240. However, the increased comparator 120 operating speed due to the change in parameters is generally lost because the sample rate of the ADC is typically held constant. In other words, the preamplifier 123 and latch 127 within the comparator 120 may finish operating sooner on a given input, but ultimate output of the latch signal still has to wait until the end of the sampling period because the ADC is still clocked at the sampling rate, which remains unchanged.

The inventor has recognized the benefit of a device that operates opposite to the effects of PVT variations. An exemplary implementation of an application of the device is for a comparator in a SAR ADC that adaptively adjusts its timing to take advantage of changes in conditions and circuit parameters to provide better performance. For example, it would be beneficial if, as the digital logic and switching speeds increase, the delay between amplifying the input signal and releasing the latch adaptively changed to allow the preamplifier or latch more time to operate on the input signal to fill the sampling period. This provides the advantage of better signal-to-noise ratios and/or lower power.

DETAILED DESCRIPTION

Embodiments of the present invention may provide a delay device that may dynamically adapt its delay based on PVT variations in the circuit environment in a manner that counteracts traditional PVT effects. Thus, if PVT effects ordinarily cause other transistors within a circuit to switch at a faster rate (for example, driving voltages increase or temperature decreases), the delay device increases its delay to operate at a slower rate. The delay device may be used as a control element to gate operations of other components within a circuit system, which can stabilize the system's throughput even when large PVT variations occur.

In another embodiment, the delay element may include an inverter, a capacitor and an output transistor. The inverter may invert a control signal that is input to the delay element. The capacitor may be coupled to the inverter's output and may begin charging when the inverter's output transitions to a high voltage level. The output transistor may have a gate coupled to the capacitor and its source coupled to a high supply voltage. The output transistor may pull an output of the delay element high when the gate voltage is lower than the high supply voltage (e.g., $V_{DD}$) by an amount that exceeds the threshold voltage (e.g., $V_{th}$). When the capacitor charges to an amount (e.g., VC) that is within the threshold ($|V_{DD}-VC|<V_{th}$), the output transistor may cease to conduct and the output voltage may drop to ground.

In another embodiment, a comparator may include an adaptive delay device. A comparator may include an input for an input signal, a control signal input, an output, a preamplifier, an adaptive delay device and a latch, both the preamplifier and the latch may be responsive to a control signal. The control signal may allow the preamplifier to amplify the input signal, and provide it to the latch. The adaptive delay device may respond to circuit conditions in the comparator, and in response, may adaptively delay the control signal applied to the preamplifier from being applied to the latch. After the delay time period, the control signal may be output to the latch. The latch may resolve the amplified input signal upon receipt of the delayed control signal, and output a digital representation of the input signal.

Figure 3:
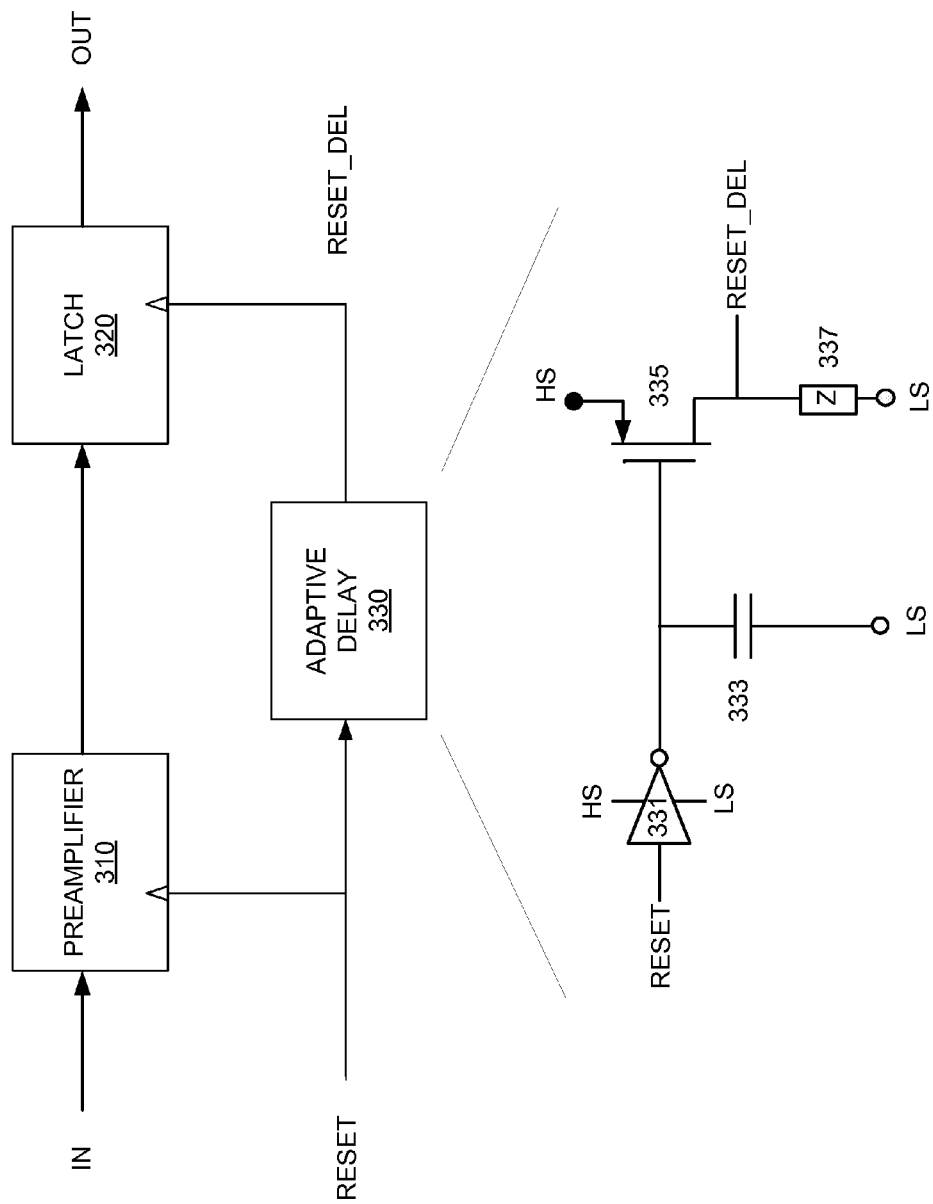
FIG. 3 illustrates an exemplary implementation of a comparator with an adaptive delay according to an embodiment of the present invention.

FIG. 3 illustrates a comparator with an adaptive delay according to an embodiment of the present invention. The exemplary comparator 300 may include a preamplifier 310, a latch 320 and an adaptive delay element 330, all of which may be fabricated in a common integrated circuit, and may operate from a common supply voltage, e.g., VDD (not shown). Thus, PVT conditions should apply to all circuit elements within the comparator 300 nearly identically.

The preamplifier 310 may have inputs for an input signal (IN) and a control signal (RESET) and an output for outputting an amplified representation of the input signal. The latch 320 may have an input coupled to an output of the preamplifier and an input for receiving a delayed control signal (RESET_DEL) from the adaptive delay element 330 and an output for outputting a voltage (OUT) representative of the digital value of the input signal IN.

The adaptive delay element 330 may have an input for receiving the control signal RESET, and an output for outputting the delayed control signal RESET_DEL. The adaptive delay element 330 may have a circuit structure that inverts effects of PVT that may occur in the preamplifier 310 and the latch 320. Thus, if switches of the preamplifier 310, latch 320 and delay element 330 may operate faster in response to decreased temperature and/or increased supply voltage VDD), the circuit structure of the adaptive delay element 330 may add delay to its operations in a manner that counteracts the PVT effects. The circuit architecture of the delay element 330, therefore, may stabilize throughput of the comparator 300 even in the presence of PVT effects.

The adaptive delay element 330 may include an inverter 331, a capacitor 333, a transistor 335 and an impedance element 337. The inverter 331 may receive the control signal RESET and be powered by a high supply voltage HS. The output of the inverter 331 may be connected to capacitor 333 and to a gate terminal of transistor 335. The capacitor 333 may also be connected to a low supply voltage LS, which may be ground. The source terminal of the transistor 335 may be connected to the high supply voltage HS, and the drain terminal of the transistor 335 may be connected to the impedance element 337. The impedance element 337 may also be connected to the low supply voltage LS. The output of the adaptive delay element 330 may be at the node between transistor 335 and impedance element 337. In operation, when a high RESET signal is applied to the inverter 331, the inverter 331 outputs a low signal causing the capacitor 333 to discharge. With the capacitor 333 discharged, transistor 335 has a significant voltage between its gate and source, and will strongly conduct, pulling the output RESET_DEL high. When RESET goes low, the inverter 331 outputs a high signal causing capacitor 333 to charge. The voltage across capacitor 333 may eventually rise to within a threshold voltage of the high supply HS, causing transistor 335 to shut off. The output voltage RESET_DEL is then pulled low through impedance element 337, and will be output.

Figure 4:
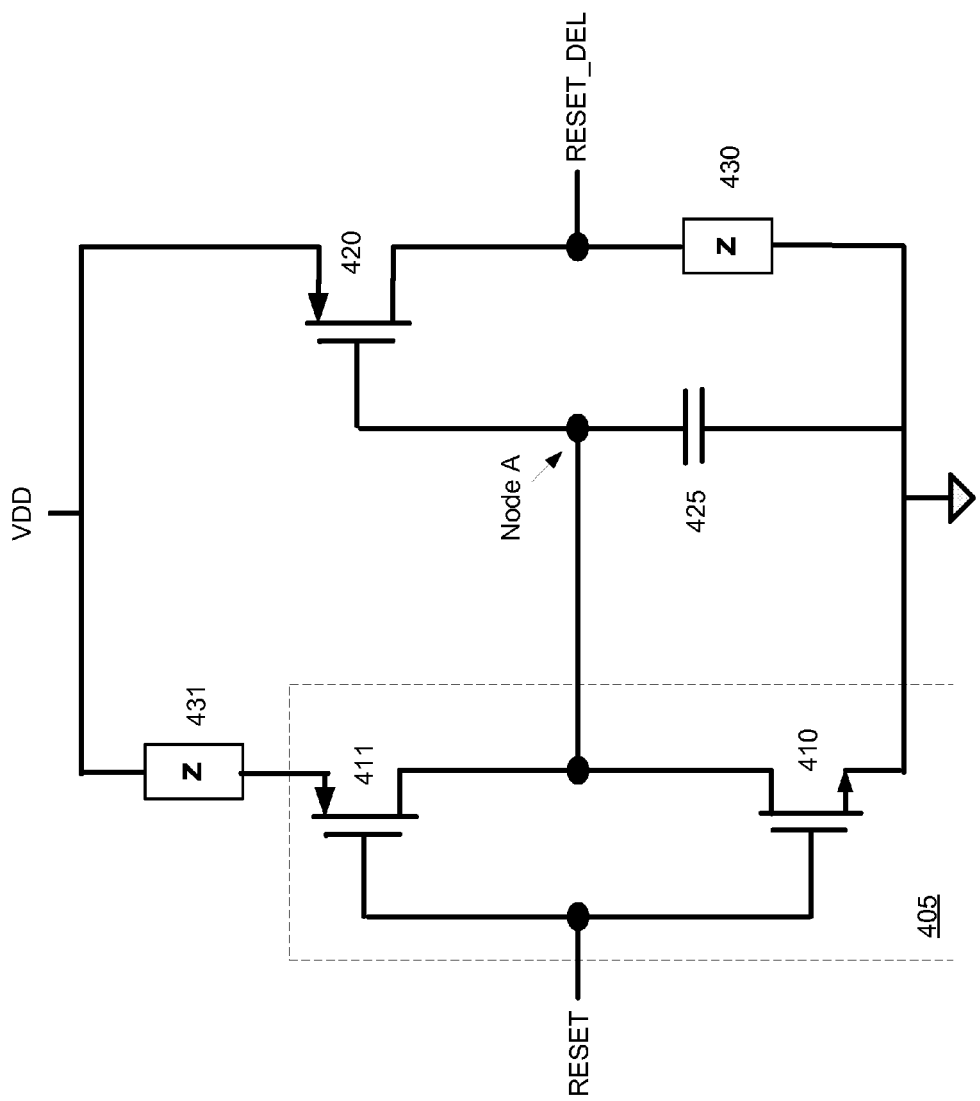
FIG. 4 illustrates an exemplary configuration of an adaptive delay device according to an embodiment of the present invention.

FIG. 4 is a circuit diagram of an adaptive delay element 400 according to an embodiment of the present invention. The adaptive delay element 400 may include an inverter 405 having an input for the control signal RESET, and an output RESET_DEL for outputting a delayed control signal, transistors 411 and 420, a capacitor 425, and a pair of impedance elements 431 and 430. The impedance elements 431 and 430 may be a resistor, transistor or some other device that may function as a current source.

The inverter 405 may include transistors 411 and 410 that may have their respective gate terminals connected to the adaptive delay element 400 input (RESET). A source terminal of transistor 411 may be connected to a terminal of a first impedance element 431. A drain terminal of transistor 411 may be connected to a drain terminal of transistor 410. A source terminal of transistor 410 may be connected to ground (or VSS). Another terminal of first impedance element 431 may be connected to VDD. The commonly connected drains of transistors 411 and 410 may be connected to an intermediate node (Node A). The intermediate node (Node A) may also be connected to a gate terminal of transistor 420 and a terminal of capacitor 425. Also connected to VDD may be a source terminal of transistor 420. The gate (or control input) terminal of transistor 420 may be connected to the intermediate node (Node A). The drain terminal of transistor 420 may be connected to the output of the adaptive delay element 400 and to a terminal of the second impedance element 430.

The second impedance element 430 may be connected between the drain terminal of the transistor 420 and ground (or VSS). Capacitor 425 may be connected between Node A and ground (or VSS). The capacitor 425 may also be a transistor configured as a capacitance device, or a device other than a capacitor that provides suitable capacitance. The output of the adaptive delay element 400 may be connected between the drain of transistor 420 and the second impedance element 430.

Figure 1:
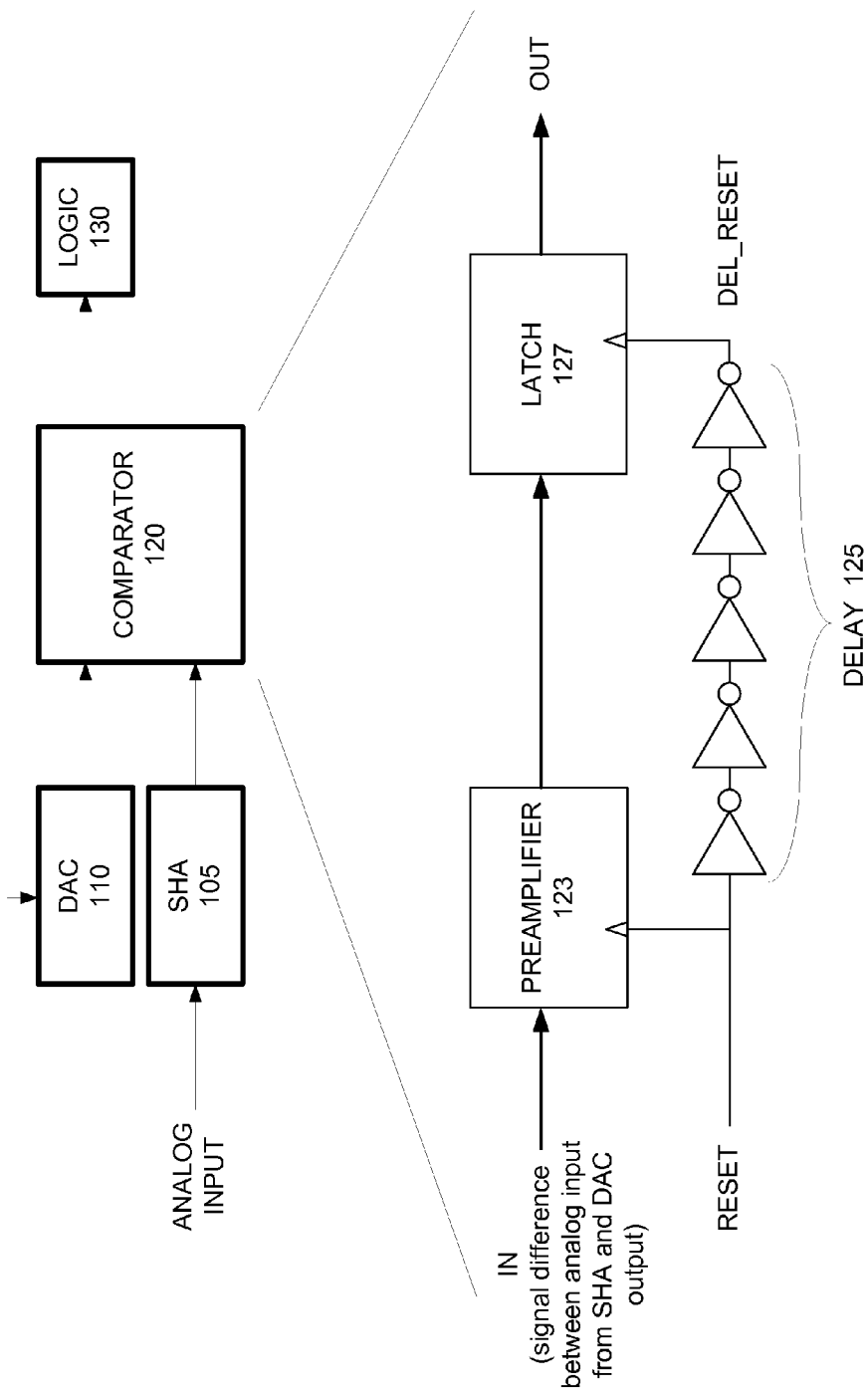
FIG. 1 illustrates a conventional comparator configuration within a SAR ADC.
Figure 2:
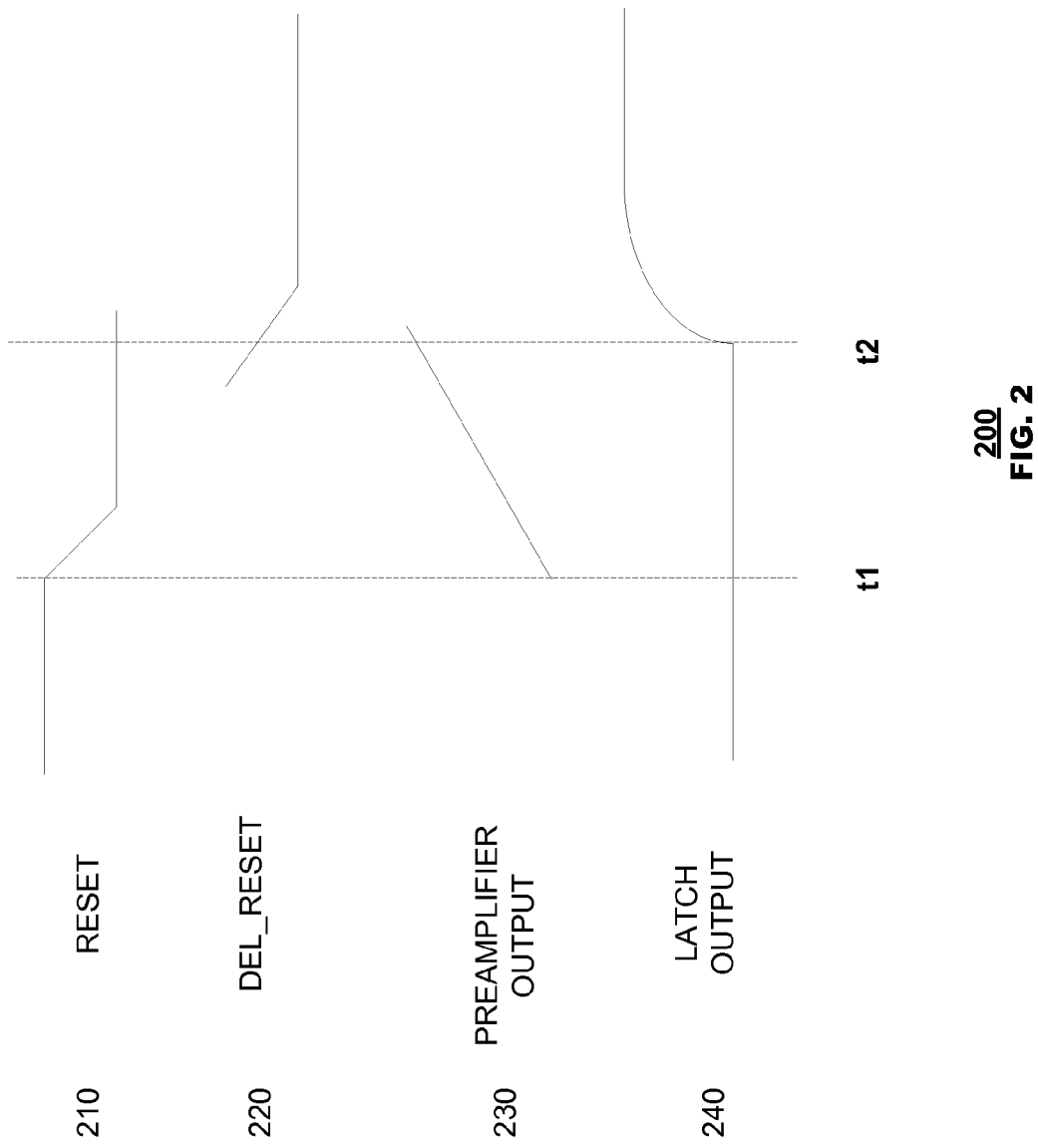
FIG. 2 illustrates an exemplary timing diagram of the conventional comparator of FIG. 1.

When operating, the adaptive delay element 400 may respond to conditions of other circuit components in the SAR ADC, for example, the supply voltage control and decision logic 130 of FIG. 1. The circuit components of the adaptive delay element 400 may be fabricated in the same processes as the other SAR ADC components. As a result, the adaptive delay element 400 may respond to a particular circuit condition in a similar manner as the other components in the SAR ADC due to the similar fabrication process. Or, the adaptive delay element 400 may be supplied with a common voltage source. In other words, the response to the circuit conditions by the adaptive delay element 400 will be substantially similar to the response of the other components of the SAR ADC to the same circuit conditions.

Figure 5:
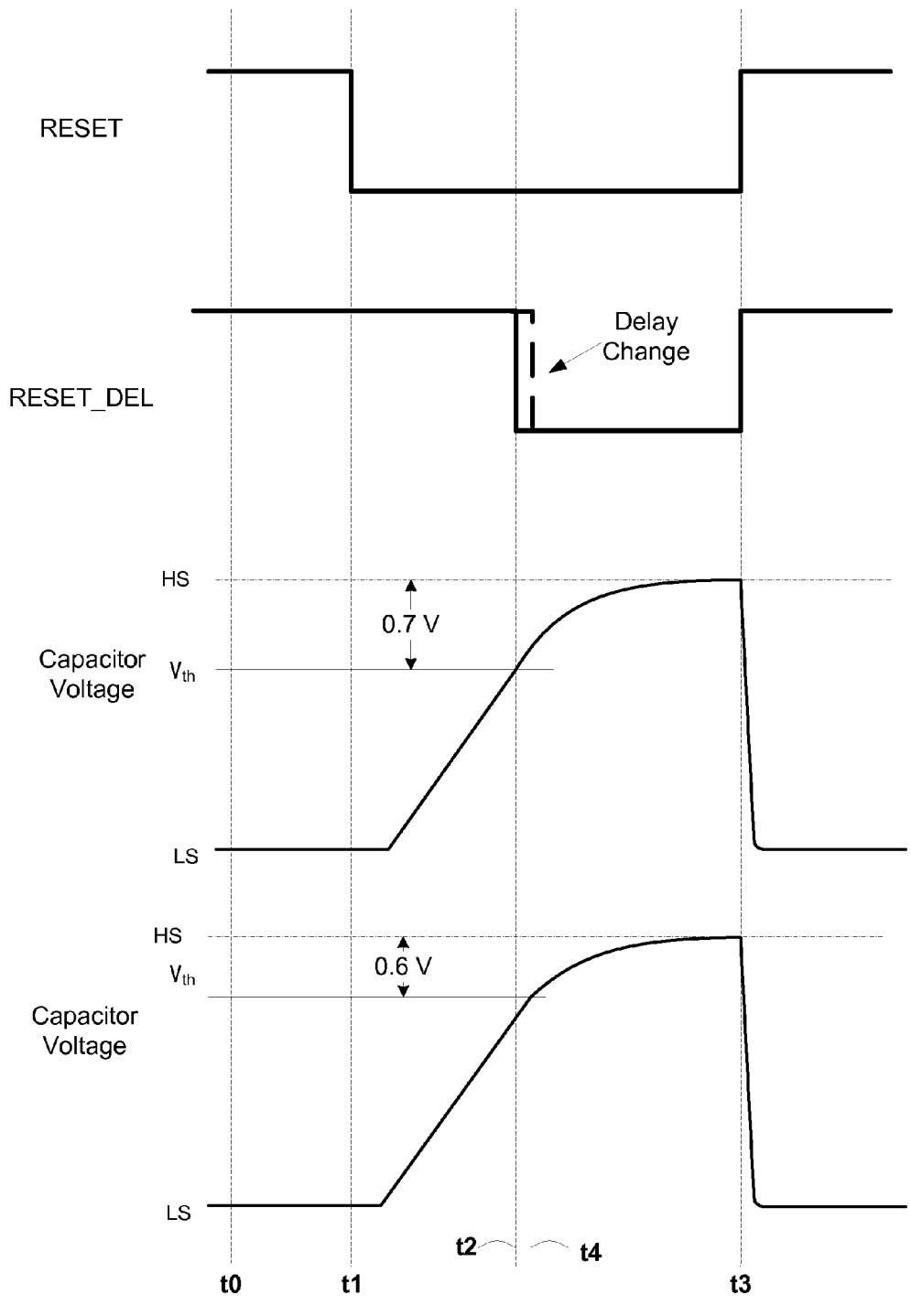
FIG. 5 illustrates an exemplary timing chart of an adaptive delay according to an embodiment of the present invention.

The first impedance element 431 may provide a constant source of current at a substantially fixed magnitude regardless of the voltage VDD. In addition, one of either transistor 410 and 411 may always be on. The signal timing of the adaptive delay element 400 will be explained with reference to the timing diagram in FIG. 5. In a first example (ex. 1), when signal RESET is high, transistor 411 may be off and transistor 410 may be on. As a result, the gate voltage applied to delay transistor 420 may be low, which causes transistor 420 to conduct, and RESET_DEL may also be high. So initially, both signals RESET and RESET_DEL may be high as shown at time t0 in FIG. 5. When the signal RESET goes low (at time t1 in FIG. 5), transistor 410 may turn off and transistor 411 may turn on, current from impedance element 431 may begin charging capacitor 425. The voltage on the capacitor 425 may rise in the form of a ramp function at a fixed slope. The current provided by the impedance element 431 may not respond to changes in VDD.

As capacitor 425 charges, the gate voltage of transistor 420 (i.e., node A voltage) provided by capacitor 425 may remain below the transistor 420 threshold voltage, and the transistor 420 may continue to conduct. As a result, signal RESET_DEL may be held high. Eventually, when the gate voltage of transistor 420 rises to within a threshold of VDD (e.g., within the gate-source voltage $V_{GS}$ of transistor 420 shown as 0.7 volts), transistor 420 will shut off, and the signal RESET_DEL may be pulled low (as shown at time t2 in FIG. 5) by the second impedance element 431 as the capacitor 425 discharges. The signal RESET_DEL remains low until the RESET signal goes high, and again both RESET and RESET_DEL are high (at time t3 of FIG. 5). The cycle may repeat based on the RESET signal.

In the first example, the gate-source voltage of delay transistor 420 is shown as 0.7 volts. In other words, once the difference between the supply voltage HS and the gate voltage provided by capacitor 425 is less than 0.7 volts, the delay transistor 420 may begin to no longer conduct. In a second example (ex. 2), due to fabrication process variations, the gate source voltage $V_{GS}$ of transistor 420 is 0.6 volts, which means transistor 420 has a smaller threshold voltage. The operation of the overall circuit is similar. Both the RESET signal and the RESET_DEL are initially high as shown at time t0. Both signals remain high for a time, until time t1 of FIG. 5, and then the RESET signal goes low, and the capacitor 425 begins to charge. Because of the fabrication process change, the capacitor voltage must rise higher, which takes a longer time. As a result, instead of RESET_DEL falling to low at time t2 as in ex. 1, its delay changes, and it falls later at time t4. Examples 1 and 2 illustrates that, in order to shut off transistor 420, the capacitor 425 must charge to a voltage that is responsive to conditions that affect circuit components. Accordingly, the time periods t1-t2 (t4) may adapt due to the effects of PVT variations.

In another example of the affects of PVT, when VDD is low, the capacitor 425 does not have to charge to as high of a voltage to reach the threshold voltage because the threshold voltage is lower due to the lower VDD. As a result, the delay is less since current provided by impedance element 431 is unaffected by variations in VDD and the threshold voltage is lower.

The output signal RESET_DEL may signal the latch to release its value for the input signal. An adaptive delay device as described with respect to FIG. 4 may be implemented adjacent to other circuit components that may be affected by PVT effects, and the adaptive delay device may react inversely to oppose the PVT effects on the other, adjacent circuit components. An adaptive delay device as shown in FIG. 4 may provide improved conversion noise performance by providing, for example, a preamplifier with additional time to amplify an analog input signal.

As explained above, certain circuitry operates more slowly or quickly as temperatures around or in the circuit components rise or fall. The changes in temperature may be accounted for by using a current source for charging capacitor 425 that provides a current that is proportional to temperature. Circuits, such as proportional-to-absolute temperature (PTAT) and complimentary-to-absolute temperature (CTAT) circuits that output a current or voltage signal in response to temperature variations are known. By leveraging this known technology, a circuit can be provided that not only responds to process fabrication differences, and supply voltage variation, but also to changes in temperature.

Figure 6:
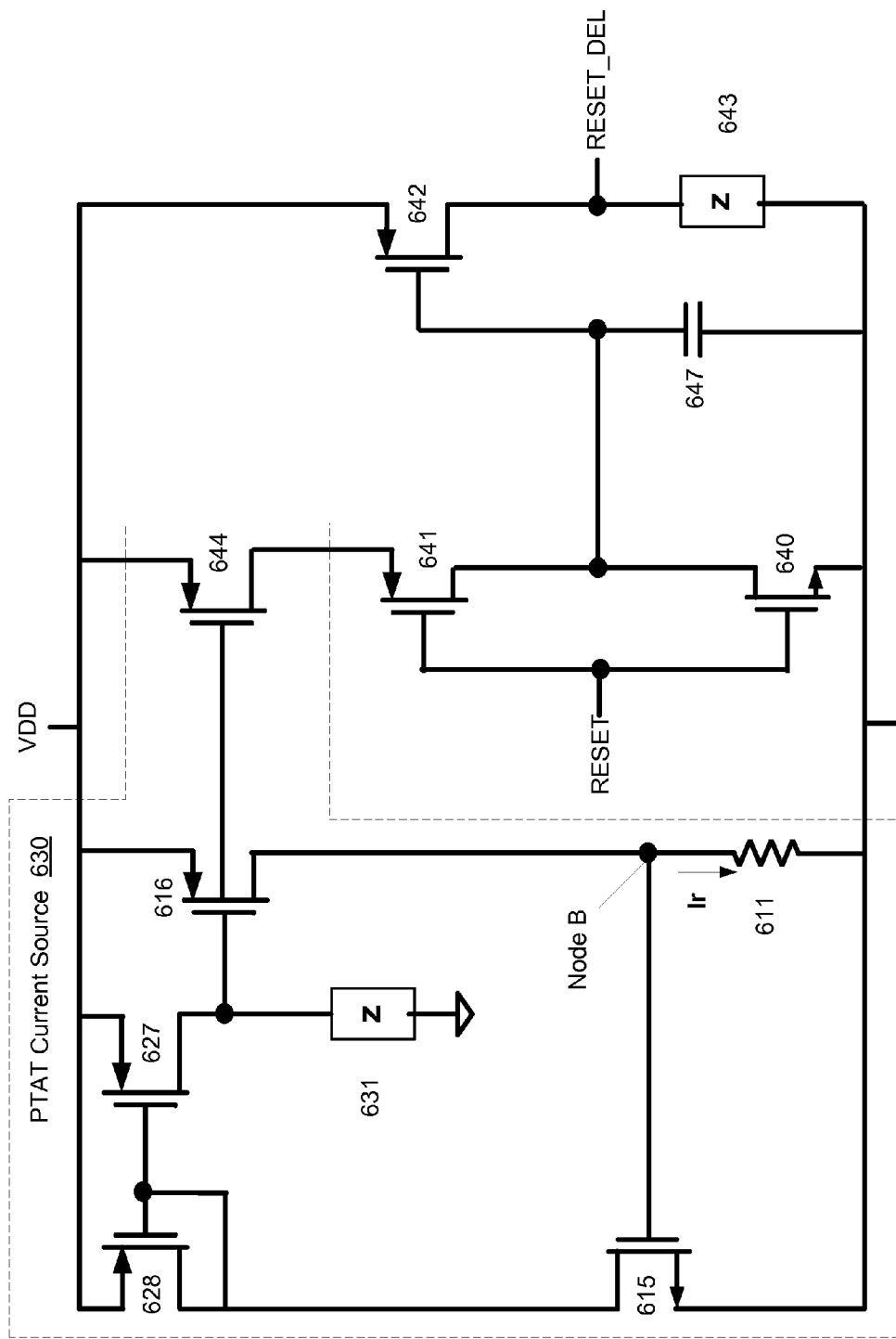
FIG. 6 illustrates an exemplary timing diagram of the operation of an adaptive delay device according to an embodiment of the present invention.

FIG. 6 illustrates an adaptive delay with an exemplary implementation of PTAT current source according to an embodiment of the present invention. Such an implementation may provide better power efficiency, and improved noise performance.

The configuration of transistors 640, 641, 642, capacitive element 647, impedance element 643 and PTAT current source 630 may be similar to the configuration of inverter 405, transistor 420, capacitive element 425 and impedance element 430 in FIG. 4. The PTAT current source 630 may replace impedance element 431 of FIG. 4. The PTAT current source 630 may include transistors 616, 627, 628, and 644 (which may be PMOS transistors), transistor 615 (which may be an NMOS transistor), resistance element 611, and an impedance element 631.

In the PTAT current source 630, the transistor 644 that may have a source terminal connected to VDD, a drain terminal connected to a source terminal transistor 641, and a gate terminal may be connected to a gate terminal of PMOS transistor 616. While transistors 616, 627 and 628, transistor 615, resistance element 611 and impedance element 631 may be configured to form an amplifier with a negative feedback loop. The PMOS transistors 628 and 627 may be configured as a current mirror. The impedance element 631 may be used to provide a bias current.

Source terminals of transistors 628 and 627 may be connected to VDD, and the gate terminals of transistors 628 and 627 may be commonly connected. The drain of transistor 628 may be connected to the commonly connected gates of transistors 628 and 627, and the drain of transistor 627 may be connected to a terminal of impedance element 631 Another terminal of impedance element 631 may be connected to ground (or VSS). A drain terminal of the transistor 615 may be connected to the drain of transistor 628, and a source terminal may be connected to ground (or VSS), and a gate terminal may be connected to a node at a terminal of resistance element 611. A source terminal of the transistor 616 may be connected to VDD. A drain terminal of transistor 616 may be connected to a node in common with the gate terminal of transistor 615 at a terminal of resistance element 611. A gate terminal of transistor 616 may be connected to a node at a drain terminal of transistor 627, and to the gate terminal of transistor 644.

Resistance element 611 may have another terminal connected to ground (or VSS). Resistance element 611 is illustrated as a resistor but may be implemented using a transistor, or other device.

During operation, the current through transistor 616 may be equal to the current Ir through resistance element 611. In other words, Ir≈(VGS of transistor 615)/R value of 611 since the voltage at node B above resistance element 611 is connected to gate of transistor 615.

Transistors 628 and 627 may form a current mirror that may provide a current mirrored from a drain terminal of transistor 615 to impedance element 631. The transistor 615 may be sized so it has a gate-source voltage VGS that is proportional to temperature. In other words, as temperature rises, the VGS of transistor 615 rises, and as temperature decreases, the VGS of transistor 615 decreases. This temperature reaction property of transistor 615 may be accomplished through sizing the gate length and width. For example, the gate length can be made long and the gate width can be made small with respect to the gate length. However, the ratio will vary from fabrication process to fabrication process.

Transistor 615 may sized to be a transistor that operates with a large overdrive voltage, in which case the transistor 615 gate voltage may be very much greater than the transistor 615 threshold voltage (i.e., VGS>>VT).

Transistors 616 and 644 may have currents that are a ratio of one another based on the sizing of each transistor since the gate voltage applied to each is the same. Accordingly, transistor 644 may pass a current that is a ratio (e.g., 1:1, 2:1, 0.75:1 and similar ratios) of the current through transistor 616. The PTAT current source 630 generates a current that varies proportionally to temperature. The current may be delivered via transistor 644. As circuit temperature decreases, the current may decrease, while conversely the delay of the falling RESET signal may be further delayed from being asserted because transistor 644 allows limited current to pass, in which case, charging of capacitive element 647 takes longer. In addition, the adaptive delay 600 may also compensate for variations in supply voltages and fabrication process changes as described above with reference of FIG. 4, for example.

Of course, a PTAT current source 630 may be implemented in a variety of configurations including, for example, using area-ratioed bipolar transistors with emitter degeneration that are common in traditional bandgap circuits or other configurations as known by those of ordinary skill in the art. The PTAT current generator 630 shown in FIG. 6 is only an example.

Figure 7:
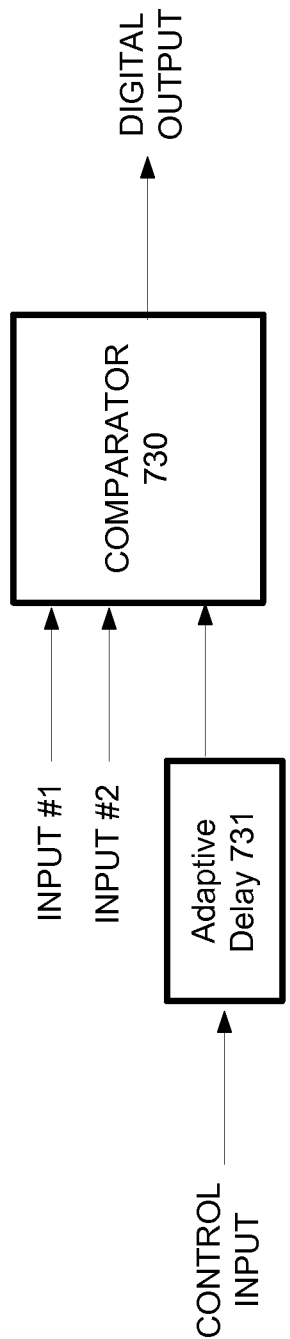
FIG. 7 illustrates an analog-to-digital converter according to an embodiment of the present invention.

In addition to the above described implementations for an exemplary adaptive delay, other implementations of the adaptive delay have been envisioned by the inventor. FIG. 7 illustrates an additional exemplary implementation.

The illustrated ADC 700 may include a comparator 730, and an adaptive delay 731. The comparator 730 may receive inputs from two inputs, and a delay control signal. For example, the two inputs (Input #1 and Input #2) may form a differential input, with which the comparator will make a decision as to whether the differential input is positive or negative. Alternatively, the two inputs might include one analog input (e.g. Input #1) and one reference input (e.g. Input #2), in which case the comparator may make a decision as to whether the analog input is greater than or less than the reference input. The adaptive delay 731 may receive a control signal that is intended to cause the comparator to resolve the analog input and output a digital representative voltage. The adaptive delay 731 may respond to changes in surrounding circuit component conditions (e.g., temperature, fabrication process variations or supply voltage variations), and adapt the delay to allow for better noise response of the comparator and/or better power performance.

Several features and aspects of the present invention have been illustrated and described in detail with reference to particular embodiments by way of example only, and not by way of limitation. It will be appreciated that modifications and variations of the present invention are covered by the above teachings and within the purview of the appended claims without departing from the spirit and intended scope of the invention. For example, NMOS devices may be interchanged with PMOS devices, and vice versa. Applied voltages may also be changed accordingly.

I claim:

1. A comparator, comprising:
  a preamplifier responsive to a first control signal;
  a latch responsive to a second control signal; and
  a delay element, having an input for the first control signal and an output for the second control signal, the delay element having a circuit structure to adaptively increase or decrease delay propagation of the first control signal in a manner that counteracts PVT effects present in other components of the comparator.

2. The comparator of claim 1, wherein the delay element further comprises:
  a capacitive element for supplying a threshold voltage to a control input of an output switch; and
  an intermediate switch for selectively delivering a current to the capacitive element, wherein the capacitive element charges to a threshold voltage that actuates the output switch which changes an output signal, wherein a time required to charge the capacitive element to the threshold voltage varies in response to circuit conditions of the comparator.

3. The comparator of claim 2, wherein a current source provides the current to the capacitive element, and the current is proportional to the temperature of circuit components of the comparator.

4. The comparator of claim 3, wherein the current source comprises:
  a first pair of transistors configured as a current mirror;
  a second pair of transistors with commonly connected control inputs connected to a drain terminal of one transistor of the first pair of transistors; and
  a single transistor with a control input connected to a terminal of a resistive element.

5. A successive approximation register analog-to-digital converter on an integrated circuit chip configured with a plurality of on-chip circuit components, comprising:
  a comparator for determining whether an input signal is representative of a digital high or low signal; and
  an adaptive delay device having an input for receiving a control signal and an output connected to the comparator, wherein the adaptive delay device is configured to respond inversely to the response of other circuit components forming the successive approximation register analog-to-digital converter, and output the control signal to the comparator based on the inverse response of the adaptive delay device.

6. The successive approximation register analog-to-digital converter of claim 5, wherein the adaptive delay device further comprises:
  a capacitive element for supplying a threshold voltage to a control input of an output switch; and
  an intermediate switch for selectively delivering a current to the capacitive element, wherein the capacitive element charges to a threshold voltage that actuates the output switch which changes an output signal, wherein the time required to charge the capacitive element to the threshold voltage is responsive to circuit conditions of the converter.

7. The successive approximation register analog-to-digital converter of claim 6, wherein the current is proportional to the temperature of circuit components of the converter, and provided by a current source.

8. The successive approximation register analog-to-digital converter of claim 7, wherein the current source comprises:
  a first pair of transistors configured as a current mirror;
  a second pair of transistors with commonly connected control inputs connected to a drain terminal of one transistor of the first pair of transistors; and
  a single transistor with a control input connected to a terminal of a resistive element.

9. A method of controlling PVT effects in a circuit system, comprising:
  responsive to a state change in an input signal, charging a capacitive element with reference to a first supply voltage; and
  when the capacitive element's output voltage reaches a voltage threshold, generating an output voltage;
  wherein the method is performed in an integrated circuit, and delays between the state change of the input signal and the generated output voltage vary inversely in response to PVT effects on other components of the integrated circuit.

10. The method of claim 9, wherein the voltage threshold is set by determining when an output voltage of the capacitive element is within a voltage threshold of a second supply voltage, opposite from the first supply voltage.

11. The method of claim 9, wherein the generated output voltage is a same voltage as the input signal.

\* \* \* \* \*

(12) INTER PARTES REVIEW CERTIFICATE (2824th)
United States Patent
Kapusta

(10) Number: US 8,487,659 K1
(45) Certificate Issued: Sep. 6, 2022

(54) COMPARATOR WITH ADAPTIVE TIMING

(75) Inventor: Ronald Kapusta

(73) Assignee: ANALOG DEVICES, INC.

Trial Number:

IPR2020-01219 filed Jul. 17, 2020

Inter Partes Review Certificate for:

Patent No.: 8,487,659
Issued: Jul. 16, 2013
Appl. No.: 13/092,465
Filed: Apr. 22, 2011

The results of IPR2020-01219 are reflected in this inter partes review certificate under 35 U.S.C. 318(b).

INTER PARTES REVIEW CERTIFICATE
U.S. Patent 8,487,659 K1
Trial No. IPR2020-01219
Certificate Issued Sep. 6, 2022

AS A RESULT OF THE INTER PARTES REVIEW PROCEEDING, IT HAS BEEN DETERMINED THAT:

Claims 1-11 are cancelled.

\* \* \* \* \*